(12) United States Patent
Iguchi

(10) Patent No.: US 6,225,697 B1
(45) Date of Patent: May 1, 2001

(54) SEMICONDUCTOR DEVICE AND METHOD FOR MANUFACTURING THE SAME

(75) Inventor: Manabu Iguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/538,291

(22) Filed: Mar. 29, 2000

(30) Foreign Application Priority Data

Mar. 29, 1999 (JP) .................................................. 11-086783

(51) Int. Cl.[7] ........................... H01L 23/48; H01L 23/52; H01L 29/40
(52) U.S. Cl. .......................... 257/758; 257/750; 257/786
(58) Field of Search .................................. 257/758, 750, 257/784, 786

(56) References Cited

U.S. PATENT DOCUMENTS 5,293,503 * 3/1994 Nishigoori .
5,773,857 * 6/1998 Ura .
5,888,900 * 3/1999 Mizuno et al. .
6,080,652 * 6/2000 Yamaha et al. .

FOREIGN PATENT DOCUMENTS 10-27799   1/1998 (JP) .
10-284600 10/1998 (JP) .

* cited by examiner

*Primary Examiner*—Sheila V. Clark
(74) *Attorney, Agent, or Firm*—McGinn & Gibb, PLLC

(57) ABSTRACT

A semiconductor device and a method for manufacturing like are provided in which wiring capacitance between adjacent wirings can be effectively reduced in a wiring structure having a dummy wiring required for planarization of an interlayer dielectric. In the semiconductor device of the present invention, a distance being approximately twice s large as a width of the wiring constituting a first wiring and a second wiring is kept between one side edge of the dummy wiring and a side edge of the first wiring as well as between another side edge of the dummy wiring and a side edge of the second wiring.

19 Claims, 10 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same and more particularly to the semiconductor device and the method for manufacturing the same in which wiring capacitance between adjacent wirings can be effectively reduced in a wiring structure having a dummy wiring required for planarization of an interlayer dielectric.

2. Description of the Related Art

In an LSI (Large Scale Integrated circuit) used as a microprocessor, a memory or a like semiconductor device, as its integration degree is improved, each of implemented devices is being scaled down in dimension to meet a requirement for smaller devices. Moreover, a semiconductor area in which devices are mounted is becoming smaller in depth and a contact hole formed in an interlayer dielectric is also becoming smaller in size as well. Thus, a scale-down of wiring in semiconductor devices is unavoidable.

A wiring structure allowing the scale-down of the wiring called a "damascene" structure is disclosed in, for example, Japanese Laid-open Patent Application No. Hei10-284600 in which a trench for wiring is formed in the interlayer dielectric in which a conductor is embedded.

FIG. 8 is a plan view of a conventional semiconductor device having the damascene wiring structure described above. FIG. 9 is a cross-sectional view of the conventional semiconductor of FIG. 8 taken along a line C—C. In FIGS. 8 and 9, on a P-type silicon substrate 51 is formed an N-type source area 52 and a drain area 53, either of which serves selectively as a device area. A gate electrode 56 composed of a polycrystalline silicon is formed on a channel area 54 disposed between the N-type source area 52 and the drain area 53. An overall surface of the P-type substrate 51 including that of the gate electrode 56 is covered by a first interlayer dielectric 57 composed of a silicon oxide film to form a MOS (Metal Oxide Semiconductor)-type transistor.

First wiring 58 composed of two or more wirings 58A, 58B, 58C, . . . , disposed in proximity to each other, is formed on the first interlayer dielectric 57 and second wiring 59 composed of a single band-shaped wiring is formed flatly in parallel to the first wiring 58 with a second interlayer dielectric disposed between the first wiring 58 and the second wiring 59. These first wiring 58 and second wiring 59 are formed so as to be of the damascene structure as described above and they constitute a first layer wiring embedded in trenches for wiring 61 formed in a second interlayer dielectric 60 composed of silicon oxide films. A part of the first wiring 58 communicates with the N-type source area 52 or the drain area 53 through a plug conductor 62 formed in the first interlayer dielectric 57. The first wiring 58 is so formed that a space between two or more wirings constituting the first wiring 58 is dense, i.e., so-called wiring density is large by implementing two or more wiring 58A, 58B, 58C, . . . so as to be placed in proximity of each other, while the second wiring 59 is so formed that its wiring placement is sparse, i.e., only a single wiring is formed.

A surface of the second interlayer dielectric 60 is planarized by a CMP (Chemical Mechanical Polishing) method. However, at the time of the CMP treatment, an occurrence of erosion 67 on the surface of the second interlayer dielectric 60 of the first wiring 58 is unavoidable, as described later.

A third interlayer dielectric 63 composed of silicon oxide films or the like is formed on the second interlayer dielectric 60 so as to cover overall surfaces of the first layer wiring composed of the first wiring 58 and the second wiring 59 and therefore the above-described MOS-type transistor is protected from outside environments.

FIGS. 10A to 10E are process diagrams showing a method for manufacturing the conventional semiconductor device in order of processes.

As shown in FIG. 10A, the N-type source area 52 and the drain area 53, either of which serves selectively as the device area, a gate oxide film 55 and the gate electrode 56 are formed on, for example, the P-type silicon substrate 51, by using a known photolithography method, ion implantation method or a like. Next, by using a CVD (Chemical Vapor Deposition) method or a like, the first interlayer dielectric 57 composed of a silicon oxide film or a like is grown thereon to form the MOS-type transistor. As shown in FIG. 10B, a contact hole is formed on the first interlayer dielectric 57 and then polycrystalline silicon or a like is embedded in the contact hole to form the plug conductor 62.

As shown in FIG. 10C, after the second interlayer dielectric 60 composed of silicon oxide films is grown on the first interlayer dielectric 57 by the CVD method or a like, trenches 61 for wiring are formed at desired positions by performing patterning on the second interlayer dielectric 60 by the photolithography. Then, as depicted in FIG. 10D, after a conductor film 66 composed of copper, aluminum or a like is formed on overall surfaces of the second interlayer dielectric 60 including the trenches 61 for wiring by the CVD method, the surface of the second interlayer dielectric 60 is planarized by the CMP method as shown in FIG. 10E. As a result, at desired positions on the second interlayer dielectric 60, are formed the first wiring 58 comprised of two or more band-shaped wirings 58A, 58B, 59C, . . . , and the single band-shaped second wiring 59, each of them having the damascene wiring structure.

The surface of the second interlayer dielectric 60 of the first wiring 58 is inferior, in terms of strength, to that of the first interlayer dielectric 57, the circumference of which is surrounded by silicon films being excellent in its strength, of the second wiring 59. Therefore, at the time of the CMP treatment on the surface of the second interlayer dielectric 60, since polishing is concentrated on the surface of the second interlayer dielectric 60 of the first wiring 58, its surface is concavely formed, causing the erosion 67.

A third interlayer dielectric 63 is then grown on the overall surface of the second interlayer dielectric 60 including that of the first wiring composed of the first wiring 58 and the second wiring 59 to protect the above MOS-type transistor from the outside environment and thus the semiconductor device is obtained.

Such conventional semiconductor devices as shown in FIGS. 8 and 9 have shortcomings that, since the occurrence of the erosion 67 on the surface of the second interlayer dielectric 60 of the first wiring 58 composed of two or more wirings each being placed tightly as described at the time of the CMP treatment of the second interlayer dielectric 60 is unavoidable, the second interlayer dielectric 60 is inferior in terms of its flatness. If an upper layer wiring is formed on the interlayer dielectric 60 being inferior in terms of flatness, it is clear that failures including deformation, breakage or a like in the upper layer readily occur, thus decreasing reliability in the semiconductor device.

To overcome such shortcomings as described above, a semiconductor device is disclosed in Japanese Laid-open Patent Application No. Hei10-27799 in which a dummy wiring is formed between a first wiring and a second wiring.

FIG. 11 is a top view of the conventional semiconductor device having the dummy wiring described above. FIG. 12 is a cross-sectional view of FIG. 11 taken along lines D—D. As shown in FIGS. 11 and 12, a plurality of electrically-insulated dummy wirings 68 is formed between the first wiring 58 and the second wiring 59 on the first interlayer dielectric 57 and at areas surrounding the second wiring 59 which is placed loosely in terms of a distance. Same reference numbers in FIGS. 11 and 12 designate corresponding to those in FIGS. 9 and 10 and descriptions of them are omitted.

As described above, by forming a plurality of dummy wirings 68 at areas surrounding the second wiring 59 is placed loosely in terms of the distance, wiring density of the second interlayer dielectric 60 can be made roughly uniform and, as a result, mechanical strength is also made uniform. Therefore, the occurrence of the erosion 67 on the surface of the second interlayer dielectric 60 of the first wiring 58 at the time of the CMP treatment can be prevented. This means that the dummy wiring 68 is indispensable for planarization of the second interlayer dielectric 60.

The occurrence of the erosion 67 can be prevented by forming the dummy wiring 68, however, an increase in the wiring capacitance cannot be prevented. However, as shown in FIGS. 11 and 12, the increase in wiring capacitance can be prevented more effectively by forming the dummy wiring 68 with the wiring split into a plurality of wirings in a planar manner rather than by forming the dummy wiring 68 integrally. That is, the increase in the wiring capacitance between the first wiring 58 and the second wiring 59 can be prevented.

FIG. 13 is a graph showing wiring capacitance obtained through a comparison between the semiconductor device according to the embodiment of the present invention and the conventional semiconductor device. That is, it shows results from a simulation performed on the wiring capacitance of the semiconductor device having the damascene structure. A white circular mark (○) with a letter "D" shows a characteristic (i.e., wiring capacitance between the first wiring 58 and the second wiring 59) corresponding to the semiconductor device having no dummy wiring shown in FIGS. 8 and 9. A black circular mark (●) with a letter "A" shows a characteristic corresponding to the semiconductor device having the dummy wiring shown in FIGS. 11 and 12. As is apparent from the comparison between the characteristics A and D, the wiring capacitance D is low in the semiconductor device having no dummy wiring shown in FIGS. 8 and 9.

As described above, in the conventional semiconductor device having the dummy wiring to planarize the interlayer dielectric, since the dummy wiring is formed by splitting simply and randomly the dummy wiring into a plurality of the wiring, effective reduction in the wiring capacitance is difficult. That is, when the dummy wiring having a specified dimension is formed, in a planar manner, on the interlayer dielectric, as depicted in FIGS. 11 and 12, it is possible to reduce the wiring capacitance more effectively by forming the dummy wiring with the wiring split to a plurality of wirings than by forming it integrally. However, if the dimension of the dummy wiring is split simply and randomly, its planar dimension is increased, resulting in an increase in a chip area. In some cases, it is almost impossible to reduce the wiring capacitance by splitting the dummy wiring simply and randomly into the plurality of wirings without taking placement or position of the dummy wiring into consideration.

SUMMARY OF THE INVENTION

In view of the above, it is an object of the present invention to provide a semiconductor device and a method for manufacturing the same in which wiring capacitance in a wiring structure with dummy wirings required for planarization of an interlayer dielectric can be effectively reduced.

According to a first aspect of the present invention, there is provided the semiconductor device including:

a first wiring formed on a first interlayer dielectric on a semiconductor substrate;

a second wiring formed in a planar manner with a second interlayer dielectric interposed between the first wiring and the second wiring on the semiconductor substrate;

two or more dummy wirings disposed between the first wiring and the second wiring and formed on the semiconductor substrate;

a third interlayer dielectric formed on the second interlayer dielectric; and whereby a distance being two to four times larger than a width of a wiring constituting the first wiring and second wiring is kept between one side edge of the dummy wiring and a side edge of the first wiring and between another side edge of the dummy wiring and a side edge of the second wiring.

According to a second aspect of the present invention, there is provided the semiconductor device including;

a first layer wiring composed of the first wiring formed on the semiconductor substrate and of the second wiring formed in the planar manner with the second interlayer dielectric interposed between the first wiring and the second wiring on the semiconductor substrate;

two or more dummy wirings disposed between the first wiring and the second wiring;

a second layer wiring formed on the third interlayer dielectric formed so as to cover, at least, the first layer wiring; and whereby the distance being two to four times larger than the width of the wiring constituting the first wiring and second wiring is kept between one side edge of the dummy wiring and the side edge of the first wiring and between the other side edge of the dummy wiring and the side edge of the second wiring.

In the foregoing, the preferable mode is one wherein the first wiring includes two or more band-shaped wirings disposed in proximity to each other and the second wiring containing a band-shaped single wiring formed in parallel to the first wiring.

Also, the preferable mode is one wherein the width of each wiring of two or more band-shaped wirings constituting the first wiring or of the single band-shaped wiring constituting the second wiring is approximately the same.

Also, the preferable mode is one wherein each of the two or more dummy wirings is formed so as to have a planar and square shape.

Also, the preferable mode is one wherein each of the two or more dummy wirings is formed so as to have a planar and regularly square shape.

Also, the preferable mode is one wherein each of the two or more dummy wirings is formed so as to have a width and space therebetween both being an integral multiple of the width of each of the first wirings or the second wiring.

Furthermore, the preferable mode is one wherein the width of the wiring is a minimum wiring width allowing microfabrication.

According to a third aspect of the present invention, there is the method for manufacturing the semiconductor device including the steps of:

forming the first interlayer dielectric on the semiconductor substrate after growing desired device areas on the semiconductor substrate;

forming trenches for wiring at places in which the second interlayer dielectric is to be formed after growing the second interlayer dielectric on the first interlayer dielectric;

forming conductive films on overall surfaces of the second interlayer dielectric containing the trenches for wiring;

planarizing the surfaces of the second interlayer dielectric;

forming the first layer wiring composed of the first wiring and the second wiring in the trenches for wiring;

forming the dummy wiring so as to have the distance being two to four times larger than the width of each of wirings constituting the first wiring and of the second wiring between one side edge of the dummy wiring and the side edge of the first wiring and between the other side edge of the dummy wiring and the side edge of the second wiring; and forming the third interlayer dielectric on overall surfaces of the second interlayer dielectric containing the first layer wiring and dummy wiring.

In the foregoing, the preferable mode is one that wherein further includes the step of forming a second layer wiring on the third interlayer dielectric after growing the third interlayer dielectric.

Also, the preferable mode is one wherein, in the wiring forming processes, the first wiring composed of two or more band-shaped wirings disposed in proximity to each other, the second wiring composed of single band-shaped wiring disposed in parallel to the first wiring and the two or more dummy wirings are simultaneously formed.

Also, the preferable mode is one wherein planarization of the surfaces of the second interlayer dielectric in the wiring forming processes is performed by a CMP method.

Furthermore, the preferable mode is one wherein the width of the wiring constituting the first wiring or the second wiring is the minimum wiring width allowing microfabrication in the wiring forming processes.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
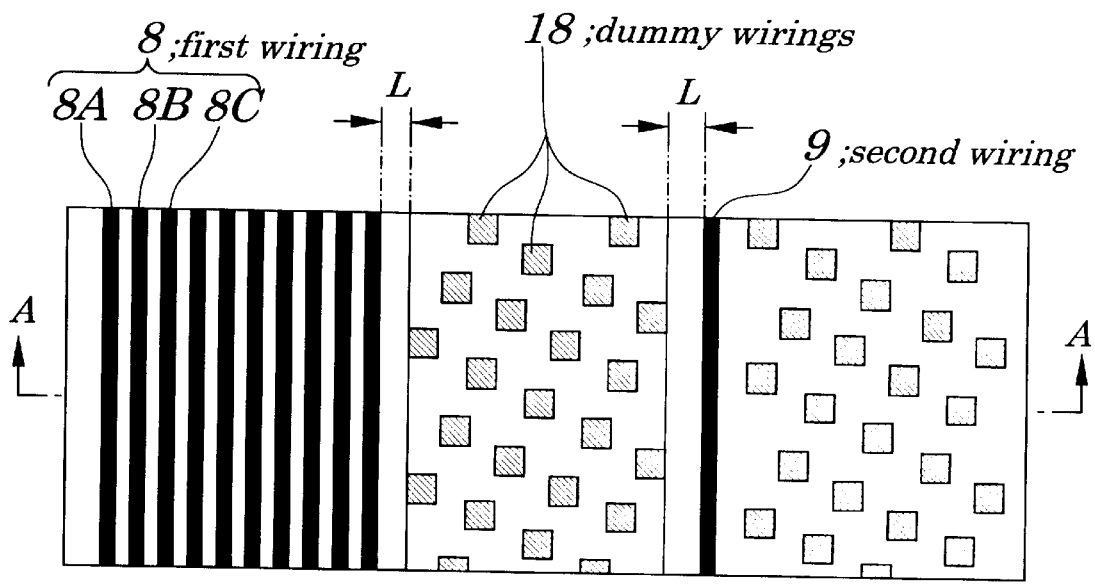
FIG. 1 is a top view showing configurations of a semiconductor device according to a first embodiment of the present invention.
Figure 2:
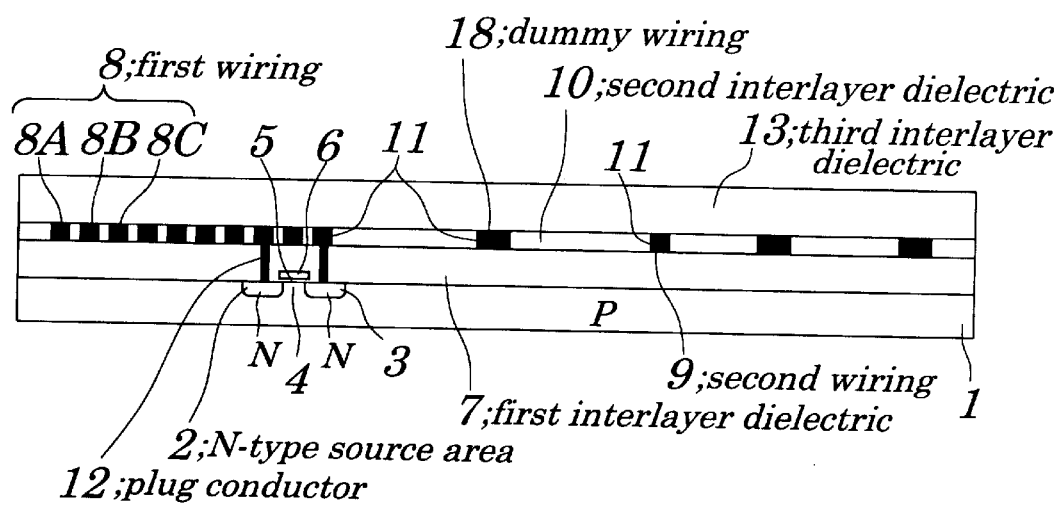
FIG. 2 is a cross-sectional view of FIG. 1 taken along a line A—A.

FIG. 1 is a top view showing configurations of a semiconductor device according to a first embodiment of the present invention. FIG. 2 is a cross-sectional view of FIG. 1 taken along a line A—A. FIGS. 3A to 3E are process diagrams showing a method for manufacturing the semiconductor device according to the first embodiment of the present invention. As shown in FIGS. 1 and 2, in the semiconductor device according to the first embodiment, on a P-type silicon substrate 1 are formed an N-type source area 2 and a drain area 3, either of which serves as a device area, and on a channel area disposed between the source area 2 and the drain area 3 is formed a gate electrode 6 composed of polycrystalline silicon through a gate oxide film 5. An overall surface including that of the gate electrode 6 is covered by a first interlayer dielectric 7 composed of silicon oxide films or a like having a thickness of a film being 0.6 $\mu$m to 0.8 $\mu$m.

On the first interlayer dielectric 7, is formed a first wiring 8 composed of two or more band-shaped wirings 8A, 8B, 8C, . . . , each having its width of about 0.28 $\mu$m, at wiring space between adjacent wirings, disposed in proximity to each other. A second wiring 9 composed of a single band-shaped wiring having a width of about 0.28 $\mu$m is formed in parallel to the first wiring 8 in a planar manner and with the first wiring 8 and a second interlayer dielectric 10 interposed. These first wiring 8 and second wiring 9 are formed so as to have the above-described damascene structure and they are embedded in trenches 11 for wiring formed in the second interlayer dielectric 10 composed of silicon oxide films having a film thickness of 0.6 $\mu$m to 0.8 $\mu$m to constitute a first layer wiring. The first wiring 8 and second wiring 9 are preferably formed to have a minimum wiring width so as to allow microfabrication to be performed thereon by lithography technology. A part of the first wiring 8 communicates with the N-type source area 2 or the drain area 3 through a plug conductor 12 composed of polycrystalline silicon or the like formed on the first interlayer dielectric 7.

The first wiring 8 is so formed that its wiring placement is tight and so-called wiring density is large by implementing two or more wirings 8A, 8B, 8C, . . . so as to be placed in proximity to each other, while the second wiring 9 is so formed that its wiring placement is loose by implementing only one single wiring. A surface of the second interlayer dielectric 10 is planarized by the CMP process.

Between the first wiring 8 and the second wiring 9 on the first interlayer dielectric 7, are formed two or more dummy wirings 18 being electrically insulated from surroundings, having a square shape with one side being about 0.56 μm and disposed at wiring space of about 0.56 μm therebetween. The dummy wiring 18 is composed of a conductor made of copper, aluminum or a like with its film thickness of 0.2 μm to 0.4 μm as in the case of the first wiring 8 and second wiring 9 constituting the first layer wiring. It is favorable from a viewpoint of designing that a width of the dummy wiring and space between wirings is set so as to be an integral multiple of a wiring width (about 0.28 μm) of the first wiring 8 or second wiring 9. It is also favorable from a viewpoint of designing that a shape of the dummy wiring 18 is selected so as to be square or regularly square.

A distance L (about 0.56 μm) being approximately twice larger than a width (about 0.28 μm) of the wiring constituting the first wiring 8 and the second wiring 9 is kept, as shown in FIG. 1, between a left side edge of the dummy wiring 18 and a right side edge of the first wiring 8 as well as between a right side edge of the dummy wiring 18 and a left side edge of the second wiring 9. That is, the dummy wiring 18 is limited to places surrounded by the above both distances L. By selecting such places for the positions of the dummy wiring 18, the wiring capacitance can be effectively reduced.

Figure 13:
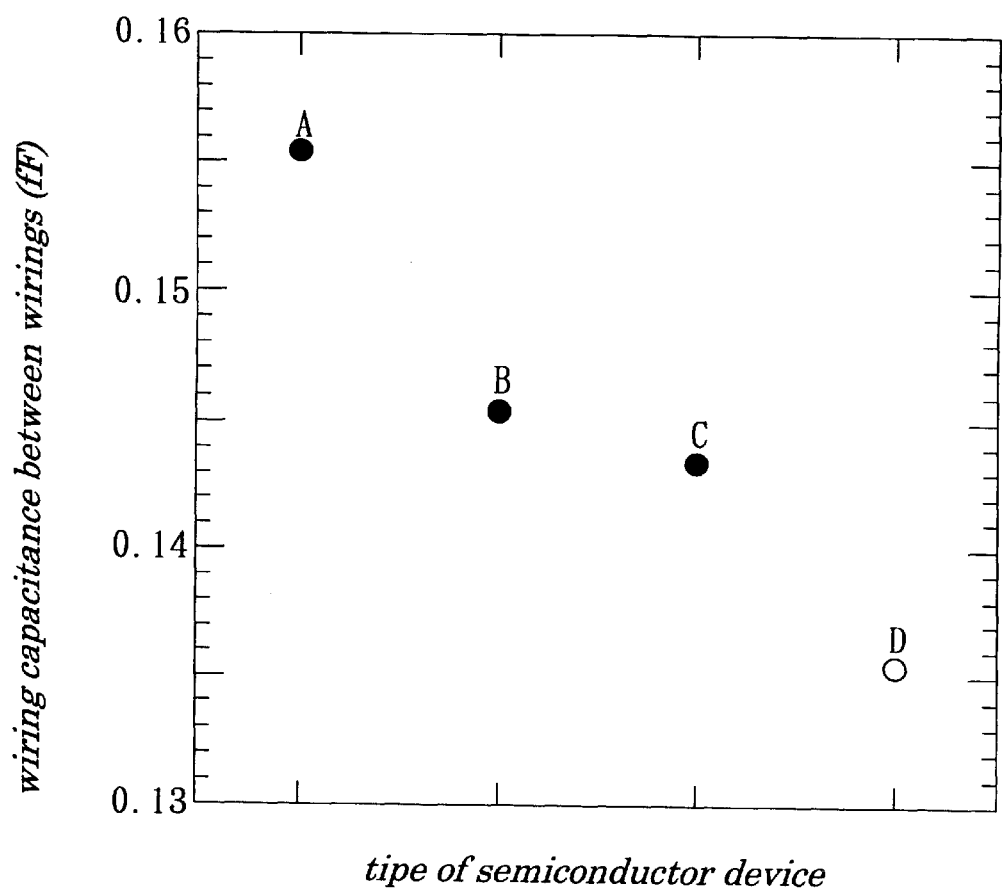
FIG. 13 is a graph showing wiring capacitance obtained through a comparison between the semiconductor device according to the embodiment of the present invention and the conventional semiconductor device.

A third interlayer dielectric 13 made of silicon oxide films with a film thickness of 0.6 μm to 0.8 μm is formed on the second interlayer dielectric 10 in a manner that it covers the first layer wiring composed of the first wiring 8 and second wiring 9 to protect the above MOS-transistor from outside environments. In FIG. 13, a black circular mark (●) with a letter "B" shows a characteristic (i.e., wiring capacitance) corresponding to the semiconductor device according to this embodiment. The wiring capacitance shown by the black circular mark with the letter "A" obtained by the conventional configurations of the semiconductor device is about 0.156 fF (femto farads), while the wiring capacitance shown by the black circular mark with the letter "B" obtained by this embodiment of the present invention is about 0.146 fF. This means that the wiring capacitance is reduced by about 6.4% in this embodiment compared with the conventional configurations.

Next, the method for producing the semiconductor device provided in this embodiment will be described in order of processes by referring to FIG. 3.

Figure 3A:
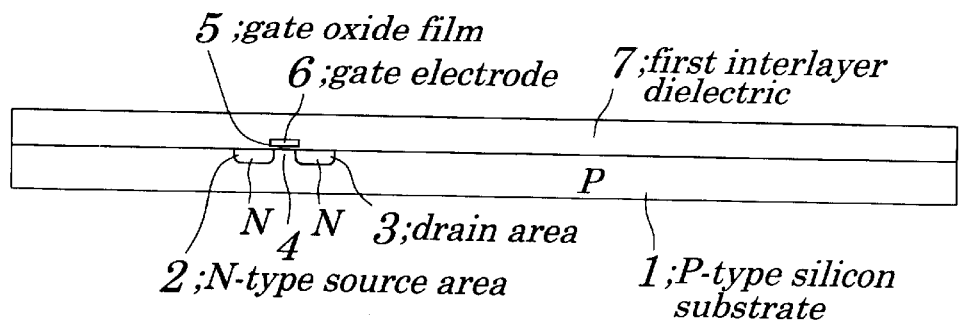
FIG. 3A to 3E are process diagrams showing a method for manufacturing the semiconductor device according to the first embodiment of the present invention.

First, as shown in FIG. 3A, the N-type source area 2 and the drain area 3, either of which serves selectively as a device area, a gate oxide film 5 and a gate electrode 6 are formed on, for example, the P-type silicon substrate 1, by using a known photolithography method, ion implantation method or a like. Next, by using a CVD method or a like, the first interlayer dielectric 7 composed of a silicon oxide film or a like with a film thickness of 0.6 μm to 0.8 μm is grown thereon to form a MOS-type transistor.

Figure 3B:
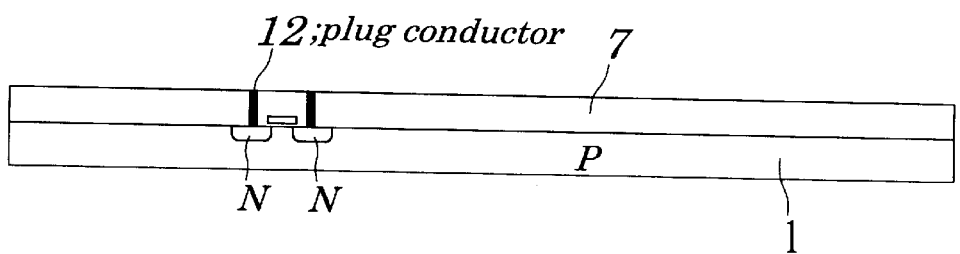
Figure 3C:
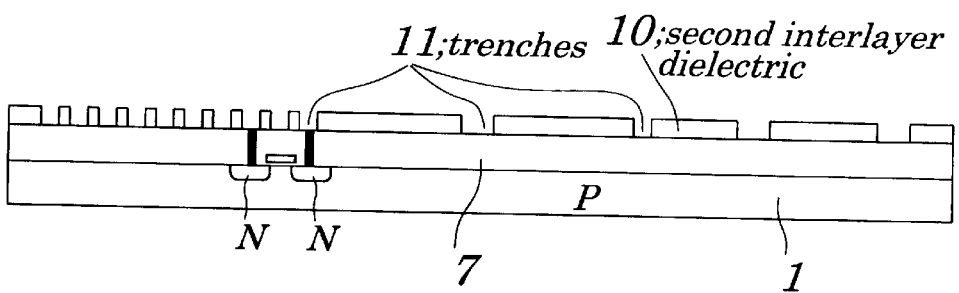

Next, as shown in FIG. 3B, a contact hole is formed on the first interlayer dielectric 7 and then polycrystalline silicon or a like is embedded in the contact hole to form the plug conductor 12. Then, as shown in FIG. 3C, after the second interlayer dielectric 10 composed of silicon oxide films with a film thickness of 0.6 μm to 0.8 μm is grown on the first interlayer dielectric 7 by the CVD method or a like, trenches 11 for wiring are formed at desired positions by performing patterning on the second interlayer dielectric 10 using the photolithography. These trenches 11 for wiring, as described later, are formed through the patterning process in a manner that each of the first wiring 8, second wiring 9 and dummy wiring 18 can be formed fitly at a predetermined position.

Figure 3D:
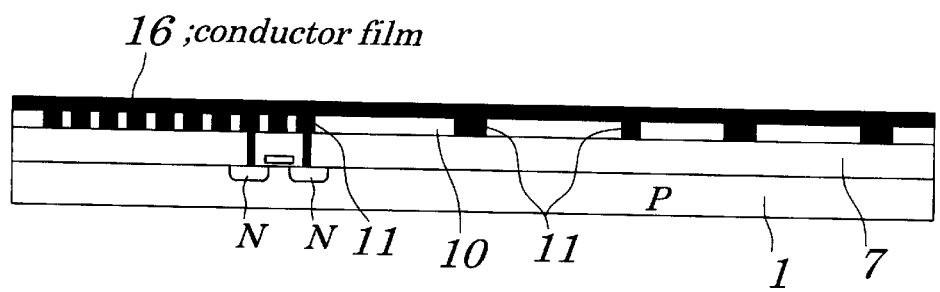
Figure 3E:
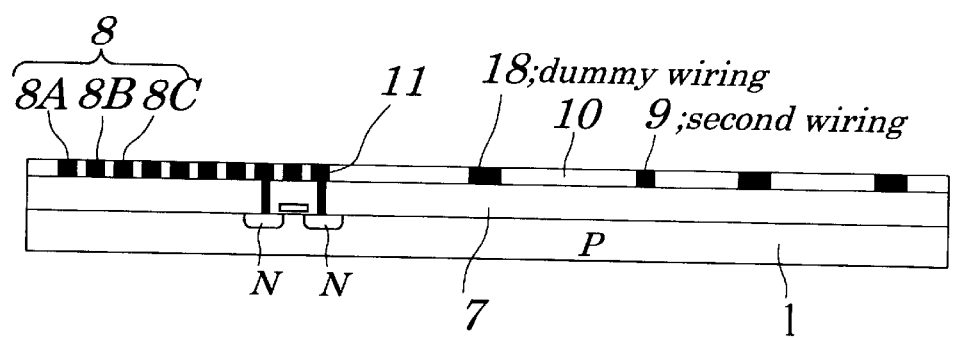

Next, as depicted in FIG. 3D, a conductor film 16 composed of copper, aluminum or a like with a film thickness of 0.2 μm to 0.4 μm is formed on overall surfaces of the second interlayer dielectric 10 including the trenches 11 for wiring by the CVD method. Then, as shown in FIG. 3E, after a surface of the second interlayer dielectric 10 is planarized by the CMP process, the first wiring 8, second wiring 9 and dummy wiring 18 are simultaneously formed. That is, the first wiring 8 composed of two or more band-shaped wirings 8A, 8B, 8C, . . . , each having its width of about 0.28 μm disposed in proximity to each other, at wiring space of about 0.28 μm therebetween, the second wiring 9 having its width of about 0.28 μm composed of band-shaped one single wiring, disposed in parallel to the first wiring 8 in a planar manner and the two or more dummy wirings 18 electrically insulated from surroundings, each being disposed at wiring space of about 0.56 μm, interposed between the first wiring 8 and second wiring 9 having a square shape with one side being about 0.56 μm, are simultaneously formed.

A distance L (about 0.56 μm) being approximately twice larger than a width (about 0.28 μm) of the wiring constituting the first wiring 8 and the second wiring 9 is kept, as shown in FIG. 1, between the left side edge of the dummy wiring 18 and the right side edge of the first wiring 8 as well as between the right side edge of the dummy wiring 18 and the left side edge of the second wiring 9.

As a result, the first wiring 8 and the second wiring 9 are formed so as to be of the damascene structure as described above, constituting the first layer wiring. Moreover, a part of the first wiring 8 communicates with the N-type source area 2 or the drain area 3 through the plug conductor 12 formed in the first interlayer dielectric 7.

Next, a third interlayer dielectric 13 composed of the silicon oxide film or the like having its film thickness of 0.6 μm to 0.8 μm is grown on the overall surface of the second interlayer dielectric 10 including the first layer wiring composed of the first wiring 8 and the second wiring 9 and therefore the above-described MOS-type transistor is protected from outside environments to produce the semiconductor device of this embodiment.

Thus, since the distance L (about 0.56 μm) being larger approximately twice than a width (about 0.28 μm) of the wiring constituting the first wiring 8 and the second wiring 9 is kept between the left side edge of the dummy wiring 18 and the right side edge of the first wiring 8 as well as between the right side edge of the dummy wiring 18 and the left side edge of the second wiring 9, the formation of the dummy wiring 18 at the place where the wiring capacitance increases can be avoided.

As described above, according to the embodiment, by constructing the semiconductor device so as to have the wiring structure containing the dummy wiring required for planarization of the interlayer dielectric, the wiring capacitance can be effectively reduced.

Second Embodiment

Figure 4:
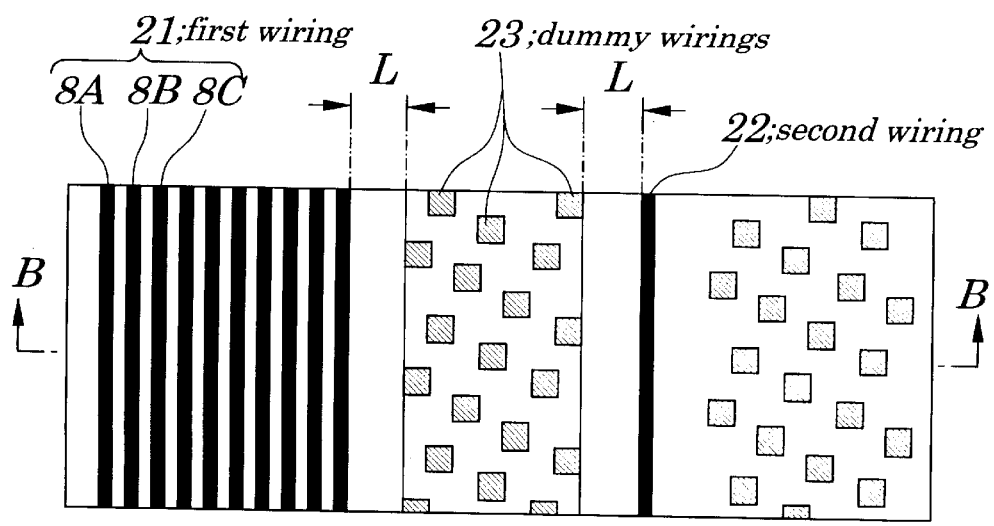
FIG. 4 is a top view showing configurations of a semiconductor device according to a second embodiment of the present invention.
Figure 5:
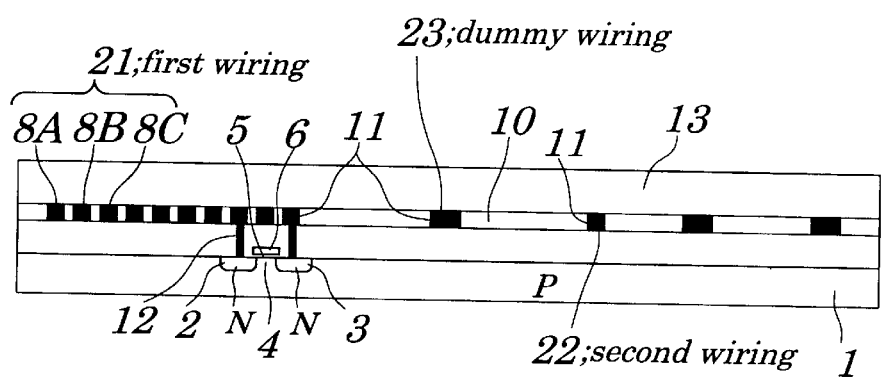
FIG. 5 is a cross-sectional view of FIG. 4 taken along a line B—B.

FIG. 4 is a top view showing configurations of a semiconductor device according to a second embodiment of the present invention. FIG. 5 is a cross-sectional view of FIG. 4 taken along a line B—B. Configurations of the semiconductor device in the second embodiment differ greatly from those in the first embodiment in that the distance kept between the left side edge of the dummy wiring and the right side edge of the first wiring as well as between the right side edge of the dummy wiring and the left side edge of the second wiring is set to be twice as large as the distance kept in the first embodiment.

In the semiconductor device according to the second embodiment, a distance L (about 1.12 µm) being approximately four times larger than a width (about 0.28 µm) of the wiring constituting the first wiring 21 and the second wiring 22 is kept, as shown in FIGS. 4 and 5, between the left side edge of the dummy wiring 23 and the right side edge of the first wiring 21 as well as between the right side edge of the dummy wiring 23 and the left side edge of the second wiring 22. That is, the dummy wiring 23 is limited to places surrounded by the above both distances L on the side of the first wiring 21 and on the side of the second wiring 22. By selecting such places for the position of the dummy wiring 23, the wiring capacitance can be effectively reduced.

Moreover, according to the second embodiment, the semiconductor device can be easily produced only by changing the pattern for wiring trenches used in the manufacturing process shown in FIG. 3C of the first embodiment.

Except this, the configurations of the second embodiment are approximately the same as those of the first embodiment. Therefore, the same reference numbers in FIGS. 4 and 5 designate corresponding parts in FIGS. 1 and 2. The description of the same components is omitted accordingly.

In FIG. 13, a black circular mark (●) with a letter "C" shows the characteristic (i.e., wiring capacitance) corresponding to the semiconductor device according to the second embodiment. The wiring capacitance shown by the black circular mark with the letter "A" obtained by the conventional configurations of the semiconductor device is about 0.156 fF (femto farads), while the wiring capacitance shown by the black circular mark with the letter "C" obtained by this embodiment of the present invention is about 0.143 fF. This means that the wiring capacitance is reduced by about 8.3% in this embodiment compared with the conventional configurations.

Thus, approximately the same effects as obtained in the first embodiment can be achieved by configurations provided in this embodiment.

Third Embodiment

Figure 6:
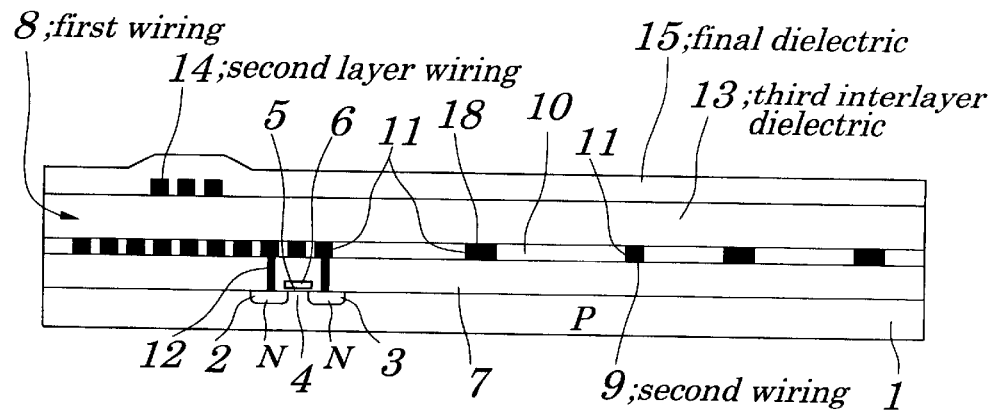
FIG. 6 is a cross-sectional view of configurations of a semiconductor device according to a third embodiment of the present invention.

FIG. 6 is a cross-sectional view of configurations of a semiconductor device according to a third embodiment of the present invention. Configurations of the semiconductor device of the third embodiment differ greatly from those of the first embodiment in that a second layer wiring is formed on the third interlayer dielectric so as to be of a multi-layered wiring structure.

According to the third embodiment, as shown in FIG. 6, at a desired place on the third interlayer dielectric 13 covering the first layer wiring composed of the first wiring 8 and the second wiring 9 is formed the second layer wiring 14, which is protected by a final dielectric 15 composed of a silicon oxide film or a like having its thickness of 0.6 µm to 0.8 µm. Thus, the semiconductor device of the multi-layered wiring structure is formed. By constructing the semiconductor device so as to be of the multi-layered wiring structure, not only wiring capacitance produced between the first wiring 8 and the second wiring 9 but also wiring capacitance produced through the third interlayer dielectric 13 between the first layer wiring composed of the first wiring 8 and second wiring 9 and the second layer wiring 14 can be reduced. The semiconductor device of this embodiment can be easily produced by sequentially forming the third interlayer dielectric 13, the second layer wiring 14 and the final dielectric 15 in the process shown in FIG. 3E of the first embodiment.

Thus, approximately the same effects as obtained in the first embodiment can be achieved by configurations provided in this embodiment.

Additionally, according to this embodiment, as described above, the wiring capacitance between the first layer wiring and the second layer wiring 14 in the multi-layered wiring structure can be reduced.

Fourth Embodiment

Figure 7:
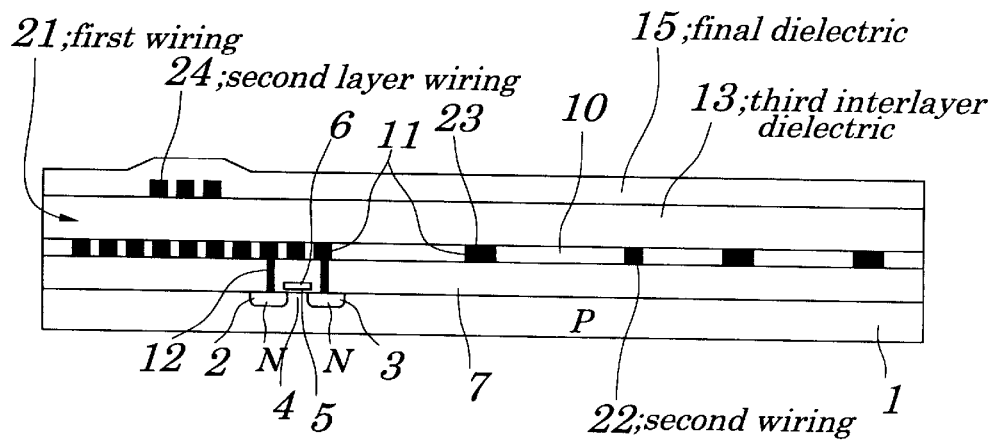
FIG. 7 is a cross-sectional view of configurations of a semiconductor device according to a fourth embodiment of the present invention.
Figure 8:
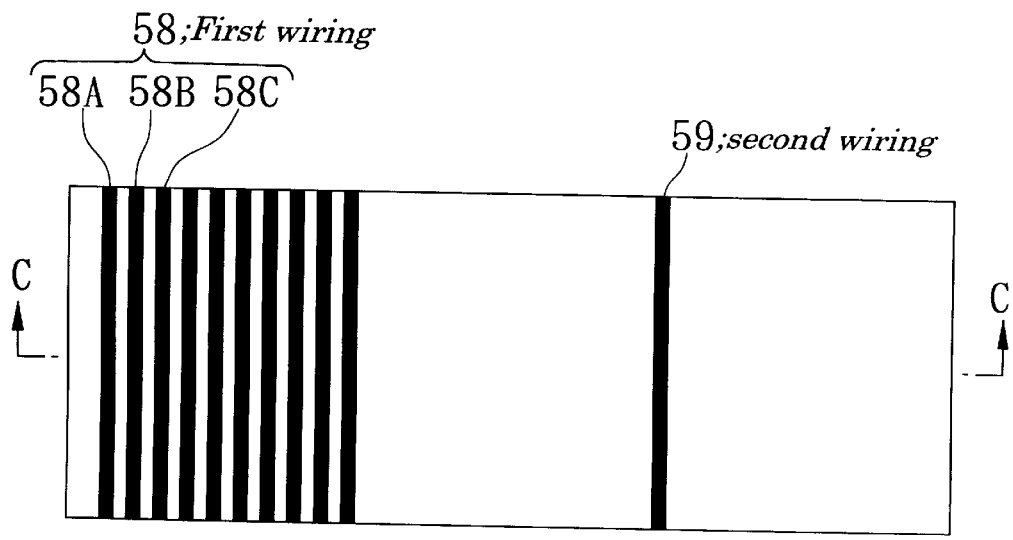
FIG. 8 is a plan view of a conventional semiconductor device having a damascene wiring structure.
Figure 9:
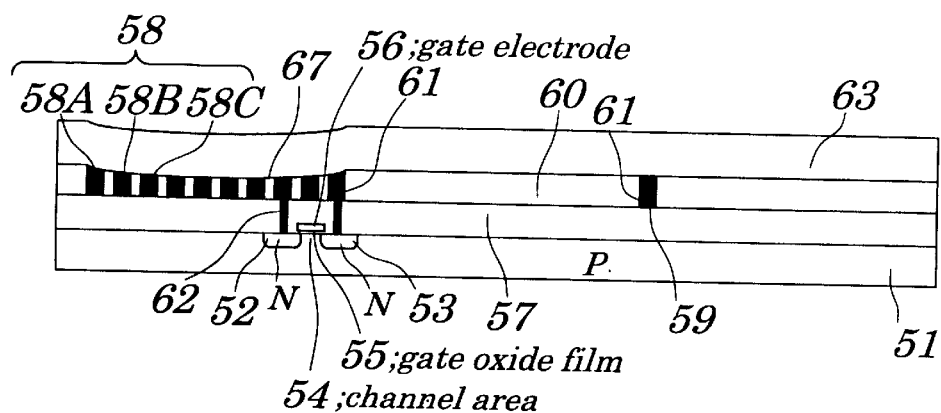
FIG. 9 is a cross-sectional view of the conventional semiconductor of FIG. 8 taken along the line C—C.
Figure 10A:
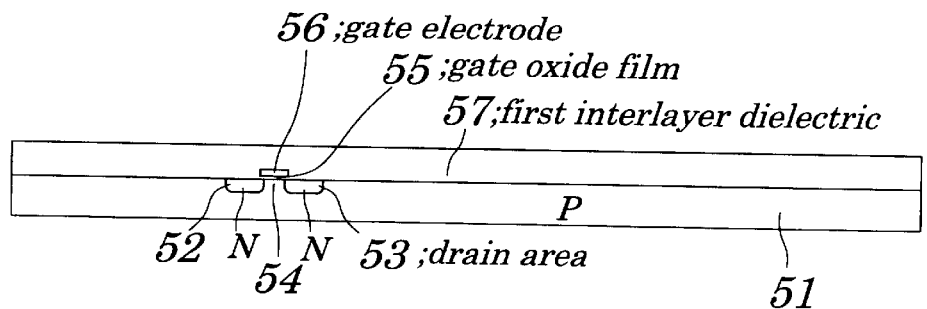
FIG. 10A through 10E are process diagrams showing a method of manufacturing the conventional semiconductor device in order of processes.
Figure 10B:
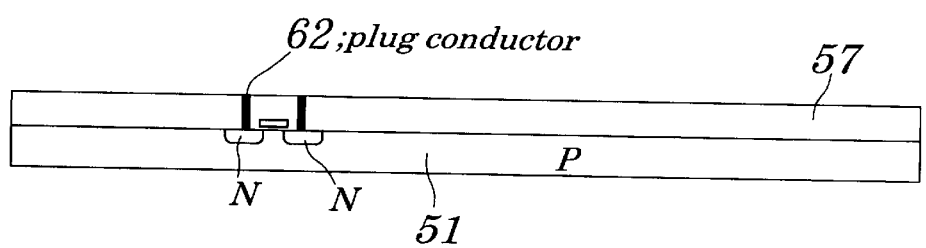
Figure 10C:
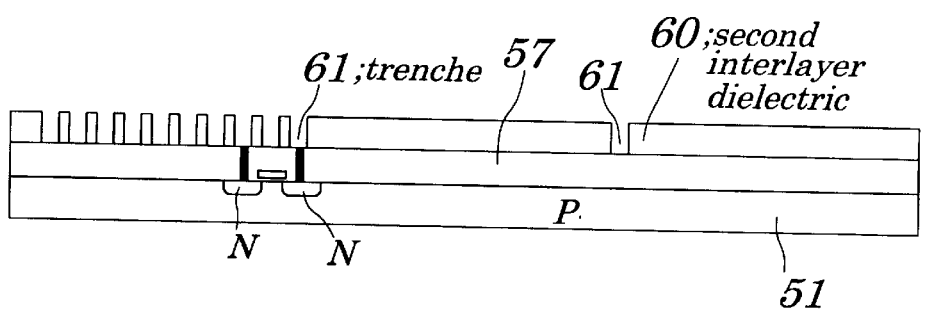
Figure 10D:
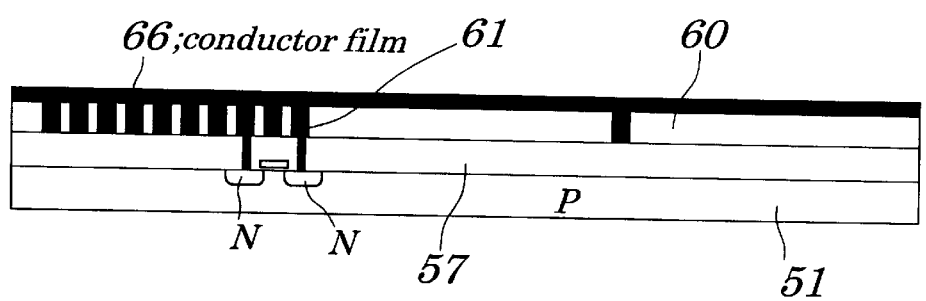
Figure 10E:
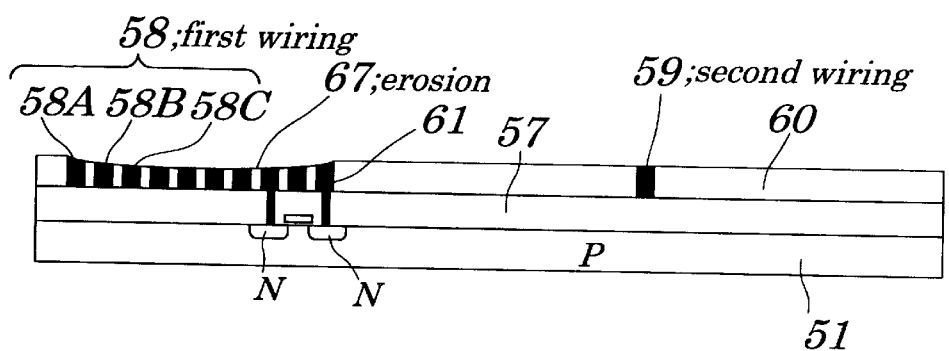
Figure 11:
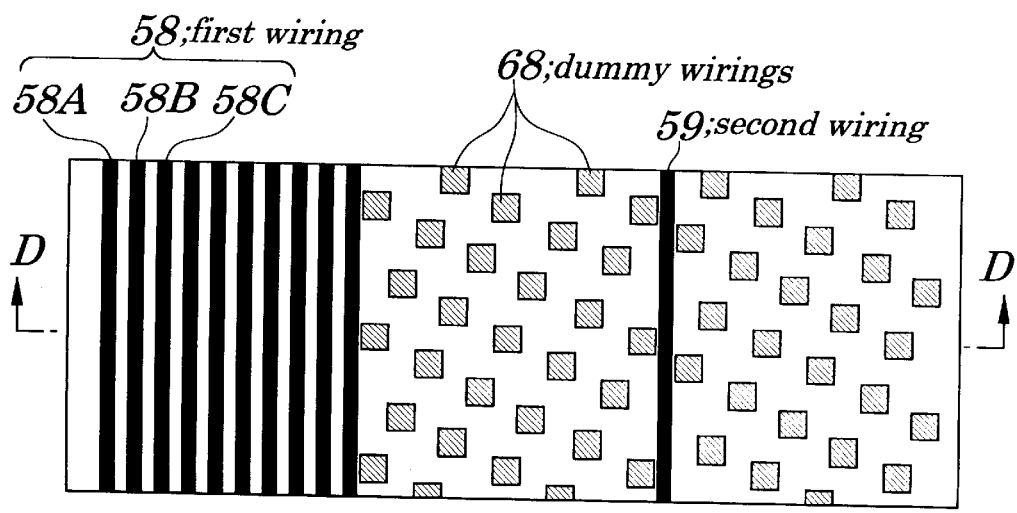
FIG. 11 is a top view of a conventional semiconductor device having dummy wirings.
Figure 12:
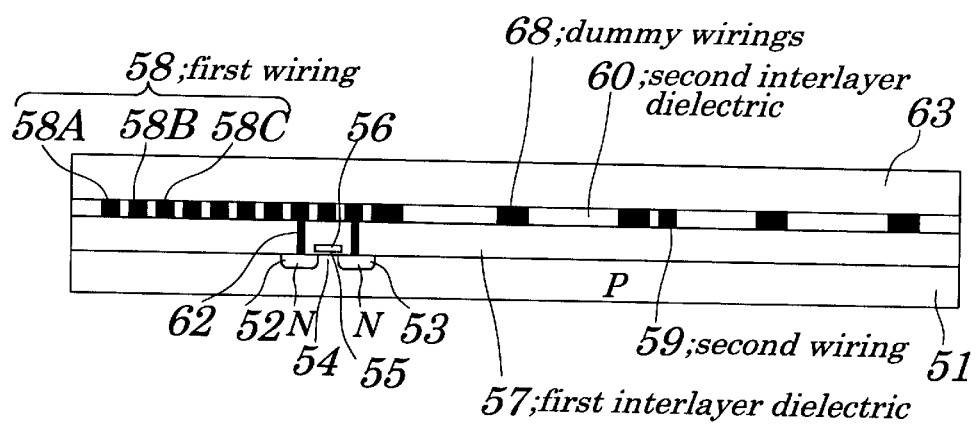
FIG. 12 is a cross-sectional view of FIG. 11 taken along lines D—D.

FIG. 7 is a cross-sectional view of configurations of a semiconductor device according to a fourth embodiment of the present invention. Configurations of the semiconductor device of the fourth embodiment differ greatly from those of the second embodiment in that the second layer wiring 24 is formed on the third interlayer dielectric 13 to produce the semiconductor device of a multi-layered wiring structure.

According to this embodiment, as shown in FIG. 7, at a desired place on the third interlayer dielectric 13 covering the first layer wiring composed of the first wiring 21 and the second wiring 22 is formed the second layer wiring 24, which is protected by the final dielectric composed of the silicon oxide film or the like. Thus, the semiconductor device of the multi-layered wiring structure is formed.

According to this embodiment, as in the case of the third embodiment, by constructing the semiconductor device so as to be of the multi-layered wiring structure, not only wiring capacitance produced between the first wiring 21 and the second wiring 22 but also wiring capacitance produced through the third interlayer dielectric 13 between the first layer wiring composed of the first wiring 21 and second wiring 22 and the second layer wiring 24 can be reduced.

Thus, approximately the same effects as obtained in the first embodiment can be achieved by configurations provided in this embodiment.

Additionally, according to this embodiment, as described above, the wiring capacitance between the first layer wiring and the second layer wiring 24 in the multi-layered wiring structure can be reduced.

As described above, since the distance being two to four times larger than a width of the wiring constituting the first wiring and the second wiring is kept between the left side edge of the dummy wiring and the right side edge of the first wiring as well as between the right side edge of the dummy wiring and the left side edge of the second wiring, the formation of the dummy wiring at the place where the wiring capacitance is increased can be avoided.

In the wiring structure having dummy wirings required for planarization of the interlayer dielectric, the wiring capacitance can be effectively reduced.

It is apparent that the present invention is not limited to the above embodiments but may be changed and modified without departing from the scope and spirit of the invention. For example, in the above embodiments, though the distance kept between the left side edge of the dummy wiring and the right side edge of the first wiring as well as between the right side edge of the dummy wiring and the left side edge of the second wiring is set to be two or four times as large as the width of wiring constituting the first wiring and the second wiring, the distance may be set to a range of two to four times to obtain the same effects. However, it is not desirable to set the distance to more than four times, because, though its planar dimension is increased, the effect to reduce wiring capacitance is decreased.

Moreover, the method for planarizing the interlayer dielectric is not limited to the CMP treatment and an etch-back method may be used for the planarization. Also, the multi-layered wiring structure having more than three layers may be selected.

The interlayer dielectric includes not only the silicon oxide film described above but also other dielectrics such as a BSG (Boro-Silicate Glass) film, a PSG (Phospho-Silicate Glass) film, a BPSG (Boro-Phospho-Silicate Glass) film or the like. The conductive type of each semiconductor area can be reversed from P-type to N-type and vice versa, i.e., the present invention may be applied not only to the N-channel MIS (Metal Insulator Semiconductor)-type transistor but also to the P-channel MIS-type transistor. In the above embodiments, the dielectric, the thickness or material of the conductive film, the method of film forming or the like are shown as examples and these may be changed depending upon its application, purpose or the like.

Finally, the present application claims the priority of Japanese Patent Application No. Hei11-086783 filed on Mar. 29, 1999, which is herein incorporated by reference.

What is claimed is:

1. A semiconductor device comprising:
   a first wiring formed on a first interlayer dielectric on a semiconductor substrate;
   a second wiring formed in a planar manner with a second interlayer dielectric interposed between said first wiring and said second wiring on said semiconductor substrate;
   two or more dummy wirings disposed between said first wiring and said second wiring and formed on said semiconductor substrate;
   a third interlayer dielectric formed on said second interlayer dielectric; and
   whereby a distance being two to four times larger than a width of said wiring constituting said first wiring and second wiring is kept between one side edge of said dummy wiring and a side edge of said first wiring and between other side edge of said dummy wiring and a side edge of said second wiring.

2. The semiconductor device according to claim 1, wherein said first wiring is comprised of two or more bandshaped wirings disposed in proximity to each other and said second wiring is comprised of a band-shaped single wiring formed in parallel to said first wiring.

3. The semiconductor device according to claim 2, wherein a width of each wiring of two or more band-shaped wirings constituting said first wiring or of said single band-shaped wiring constituting said second wiring is approximately the same.

4. The semiconductor device according to claim 1, wherein each of said two or more dummy wirings is formed so as to have a planar and square shape.

5. The semiconductor device according to claim 4, wherein each of said two or more dummy wirings is formed so as to have a planar and regularly square shape.

6. The semiconductor device according to claim 1, wherein each of said two or more dummy wirings is formed so as to have a width and space therebetween both being an integral multiple of said width of each of said first wirings or said second wiring.

7. The semiconductor device according to claim 1, wherein said width of said wiring is a minimum wiring width allowing microfabrication.

8. A semiconductor device comprising;
   a first layer wiring composed of a first wiring formed on a semiconductor substrate and of a second wiring formed in a planar manner with a second interlayer dielectric interposed between said first wiring and said second wiring on said semiconductor substrate;
   two or more dummy wirings disposed between said first wiring and said second wiring;
   a second layer wiring formed on a third interlayer dielectric formed so as to cover, at least, said first layer wiring; and
   whereby a distance being two to four times larger than a width of said wiring constituting said first wiring and second wiring is kept between one side edge of said dummy wiring and one side edge of said first wiring and between other side edge of said dummy wiring and one side edge of said second wiring.

9. The semiconductor device according to claim 8, wherein said first wiring is comprised of two or more band-shaped wirings disposed in proximity to each other and said second wiring is comprised of a band-shaped single wiring formed in parallel to said first wiring.

10. The semiconductor device according to claim 9, wherein a width of each wiring of two or more band-shaped wirings constituting said first wiring or of said single band-shaped wiring constituting said second wiring is approximately the same.

11. The semiconductor device according to claim 8, wherein each of said two or more dummy wirings is formed so as to have a planar and square shape.

12. The semiconductor device according to claim 11, wherein each of said two or more dummy wirings is formed so as to have a planar and regularly square shape.

13. The semiconductor device according to claim 8, wherein each of said two or more dummy wirings is formed so as to have a width and space therebetween both being an integral multiple of said width of each of said first wirings or said second wiring.

14. The semiconductor device according to claim 8, wherein said width of said wiring is a minimum wiring width allowing microfabrication.

15. A method for manufacturing a semiconductor device comprising the steps of:
    forming a first interlayer dielectric on a semiconductor substrate after growing desired device areas on said semiconductor substrate;
    forming trenches for wiring at places in which a second interlayer dielectric is to be formed after growing said second interlayer dielectric on said first interlayer dielectric;
    forming conductive films on overall surfaces of said second interlayer dielectric containing said trenches for wiring;
    planarizing said surfaces of said second interlayer dielectric;
    forming a first layer wiring composed of a first wiring and a second wiring in said trenches for wiring;
    forming a dummy wiring so as to have a distance being two to four times larger than a width of each of wirings constituting said first wiring and of said second wiring between one side edge of said dummy wiring and a side edge of said first wiring and between other side edge of said dummy wiring and a side edge of said second wiring; and
    forming a third interlayer dielectric on overall surfaces of said second interlayer dielectric containing said first layer wiring and dummy wiring.

16. The method for manufacturing the semiconductor device according to claim 15, further comprising a step of forming a second layer wiring on said third interlayer dielectric after growing said third interlayer dielectric.

17. The method for manufacturing the semiconductor device according to claim 15, wherein, in said wiring forming processes, said first wiring composed of two or more band-shaped wirings disposed in proximity to each other, said second wiring composed of single band-shaped wiring disposed in parallel to said first wiring and said two or more dummy wirings are simultaneously formed.

18. The method for manufacturing the semiconductor device according to claim 15, wherein planarization of said surfaces of said second interlayer dielectric in said wiring forming processes is performed by a chemical mechanical polishing method.

19. The method for manufacturing the semiconductor device according to claim 15, wherein a width of said wiring constituting said first wiring or said second wiring is a minimum wiring width allowing microfabrication in said wiring forming processes.

* * * * *